United States Patent [19]

Spence et al.

[11] Patent Number: 5,455,542
[45] Date of Patent: Oct. 3, 1995

[54] SYMMETRICAL CLOCK CRYSTAL OSCILLATOR CIRCUIT

[75] Inventors: John R. Spence, Villa Park; Rajiv Gupta, Brea; Ming M. Zhang, Irvine, all of Calif.

[73] Assignee: Rockwell International Corporation, Seal Beach, Calif.

[21] Appl. No.: 155,500

[22] Filed: Nov. 22, 1993

[51] Int. Cl.$^6$ ...................................................... H03B 5/30
[52] U.S. Cl. ............... 331/158; 331/116 R; 331/116 FE; 331/74; 331/77
[58] Field of Search ............................ 331/158, 116 FE, 331/116 R, 74, 160, 75, 76, 77; 307/261; 327/100

[56] References Cited

U.S. PATENT DOCUMENTS 5,163,263  8/1992  Lane .......................................... 331/158
5,270,670  12/1993  Bladh ......................................... 331/74

*Primary Examiner*—Robert J. Pascal
*Assistant Examiner*—Arnold Kinkead
*Attorney, Agent, or Firm*—George A. Montanye; David J. Arthur; Tom Streeter

[57] ABSTRACT

An oscillator circuit provides a symmetrical signal without halving the frequency of a crystal oscillator 12. The input 14 of the crystal oscillator 12 is low pass filtered, and the output 18 of the filter 16 is differential voltage compared with the input 14 of the crystal oscillator 12. The output 22 of the differential voltage comparator 20 is symmetrical and of the same frequency as the crystal oscillator 12. The crystal oscillator 12 is preferably a Pierce oscillator.

8 Claims, 2 Drawing Sheets

SYMMETRICAL CLOCK CRYSTAL OSCILLATOR CIRCUIT

BACKGROUND OF THE INVENTION

The present invention relates to oscillator circuits and has particular relation to high frequency symmetrical oscillator circuits.

A clock signal must be very symmetrical. The conventional way to produce such a signal is with a crystal oscillator and a flip-flop. The crystal produces a fairly assymetrical signal, but each rising edge can be used to trigger a divide-by-two (D–) flip-flop. The D– flip-flop has a much more symmetrical output.

However, the output of the D– flip-flop is only half the crystal's frequency. This presents no real difficulty until clock speeds approach half the frequency of available crystals. The present invention provides clock-quality square waves without dividing the crystal's frequency by two.

SUMMARY OF THE INVENTION

According to the present invention, the input of the crystal oscillator is low pass filtered, and the output of the filter is differential voltage compared with the input of the crystal oscillator. The output of the differential voltage comparator is symmetrical and of the same frequency as the crystal.

DETAILED DESCRIPTION OF A PREFERRED EMBODIMENT

Figure 1:
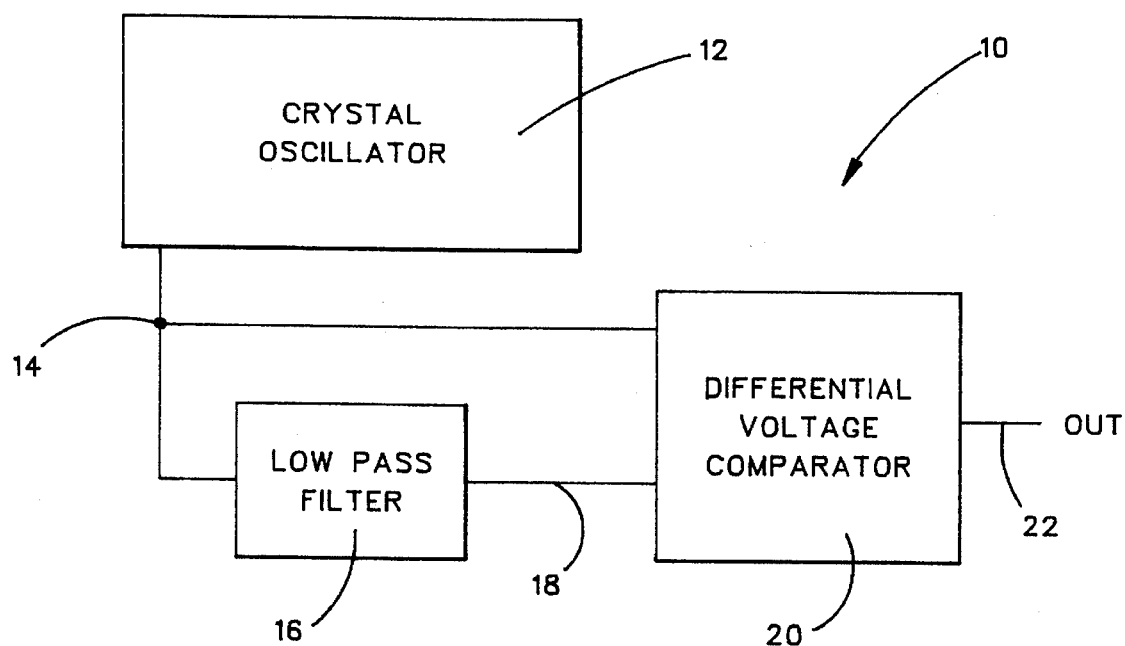
FIG. 1 is a block diagram of the present invention.

In FIG. 1, an oscillator 10 according to the present invention includes a crystal oscillator 12 with an input 14. The input 14 is passed through a low pass filter 16, producing a filtered output 18. A-differential voltage comparator 20 compares the filtered output 18 with the unfiltered input 14. The output 22 of the differential voltage comparator 20 is at the same frequency as the input 14 of the crystal oscillator 12, but is much more symmetrical.

Figure 2:
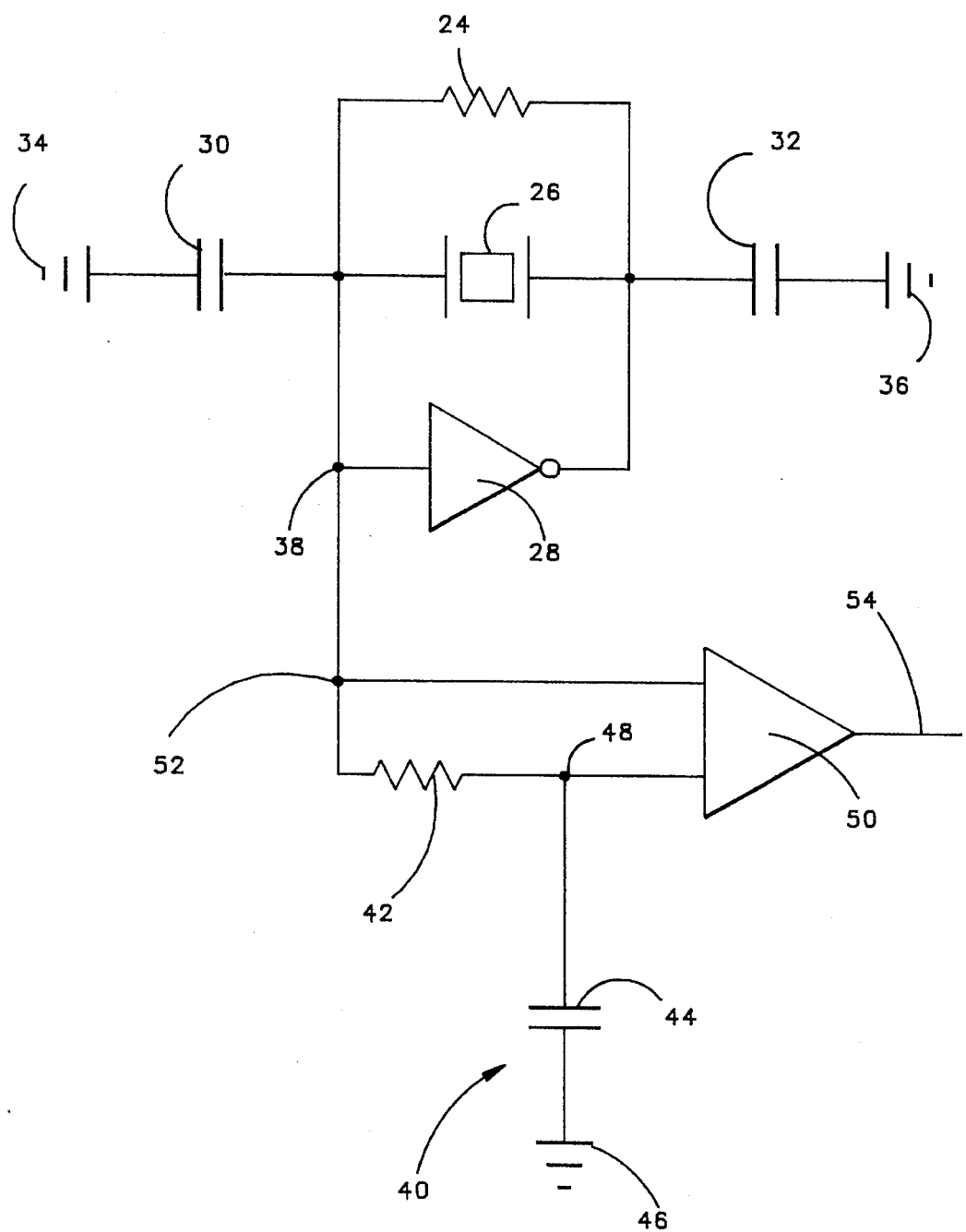
FIG. 2 is a mechanization of the block diagram of FIG. 1.

In FIG. 2, a resistor 24, crystal 26, and inverter 28 are placed in parallel, thereby forming a Pierce oscillator. Capacitors 30 and 32, respectively connected to grounds 34 and 36, are attached to the input and output ends, respectively, of the oscillator in order to assure stable performance.

The input 38 of the oscillator is connected to a low pass filter 40, preferably an RC filter comprising a resistor 42 and capacitor 44, the capacitor 44 being grounded by a ground 46. The output 48 of the filter 40 Is fed to a differential voltage amplifier 50, the other input 52 being driven by the raw input 38 of the oscillator. The output 54 of the amplifier 50 is the output of the present invention.

Industrial Applicability

The present invention can be used whenever it is desired to produce a high frequency symmetrical clock signal. It may be made from components which, separate and apart from one another, are entirely conventional, or it can be made from their non-conventional analogs.

While a particular embodiment of the present invention has been described in some detail, the true spirit and scope of the present invention are not limited thereto, but are limited only by the following claims.

What is claimed is:

1. An oscillator circuit, comprising:
   (a) a crystal oscillator having an input;
   (b) a low pass filter, not included in the oscillator, having an input and an output, the input of the low pass filter being connected to the input of the crystal oscillator; and
   (c) a differential voltage comparator having an output and two inputs, one of the inputs being connected to the output of the low pass filter and the other input being connected to the input of the crystal oscillator, the output of the differential voltage comparator being an output of the oscillator circuit.

2. The oscillator circuit of claim 1, wherein the low pass filter comprises an RC filter.

3. The oscillator circuit of claim 1, wherein the differential voltage comparator comprises a differential voltage amplifier.

4. The oscillator circuit of claim 3, wherein the low pass filter comprises an RC filter.

5. The oscillator circuit of claim 1, wherein the crystal oscillator comprises a Pierce oscillator.

6. The oscillator circuit of claim 5, wherein the low pass filter comprises an RC filter.

7. The oscillator circuit of claim 5, wherein the differential voltage comparator comprises a differential voltage amplifier.

8. The oscillator circuit of claim 7, wherein the low pass filter comprises an RC filter.

* * * * *